United States Patent
Smith et al.

(10) Patent No.: US 6,469,895 B1
(45) Date of Patent: Oct. 22, 2002

(54) INTEGRATED CIRCUIT MOUNTING STRUCTURE INCLUDING A SWITCHING POWER SUPPLY

(75) Inventors: David Anthony Smith; Neal G. Stewart, both of Sai Kung (HK)

(73) Assignee: Astec International Limited, Hong Kong (HK)

( * ) Notice: Subject to any disclaimer, the term of this patent is extended or adjusted under 35 U.S.C. 154(b) by 1104 days.

(21) Appl. No.: 08/847,606

(22) Filed: Apr. 23, 1997

Related U.S. Application Data

(62) Division of application No. 08/523,633, filed on Sep. 5, 1995, now Pat. No. 5,694,297.

(51) Int. Cl.[7] .................................................. H05K 7/20
(52) U.S. Cl. ...................... 361/704; 257/691; 257/713; 257/723; 257/724; 361/718; 361/722
(58) Field of Search ................................ 257/691, 723, 257/724, 706–707, 712–713; 307/150; 324/755; 327/540, 541; 361/686, 687, 690, 695, 697, 704, 707, 717–718, 722, 767, 784, 785, 792, 809–811; 437/209, 211, 214

(56) References Cited

U.S. PATENT DOCUMENTS

| | | | |
|---|---|---|---|
| 4,326,134 A | | 4/1982 | Owen et al. |
| 4,899,254 A | | 2/1990 | Ferchau et al. |
| 5,023,476 A | * | 6/1991 | Watanabe et al. ............ 327/540 |
| 5,132,555 A | * | 7/1992 | Takahashi .................... 327/540 |
| 5,368,094 A | | 11/1994 | Hung |
| 5,410,467 A | | 4/1995 | Smith et al. |
| 5,430,610 A | | 7/1995 | Hung |
| 5,444,298 A | * | 8/1995 | Schutz ........................ 257/691 |
| 5,481,436 A | | 1/1996 | Werther |
| 5,556,811 A | * | 9/1996 | Asatstein et al. ............ 437/209 |

* cited by examiner

Primary Examiner—Gregory Thompson
(74) Attorney, Agent, or Firm—Coudert Brothers LLP

(57) ABSTRACT

A semiconductor packaging structure comprising a hybrid IC package having at least one IC chip mounted therein is disclosed. The semiconductor packaging structure includes a DC-DC switching power supply within the hybrid IC package that is electrically coupled to at least one of the IC chips by conductive paths formed in said hybrid IC package for supplying at least one specified voltage to the at least one IC chip. Power is supplied to the DC-DC switching power supply from a remote power source.

10 Claims, 4 Drawing Sheets

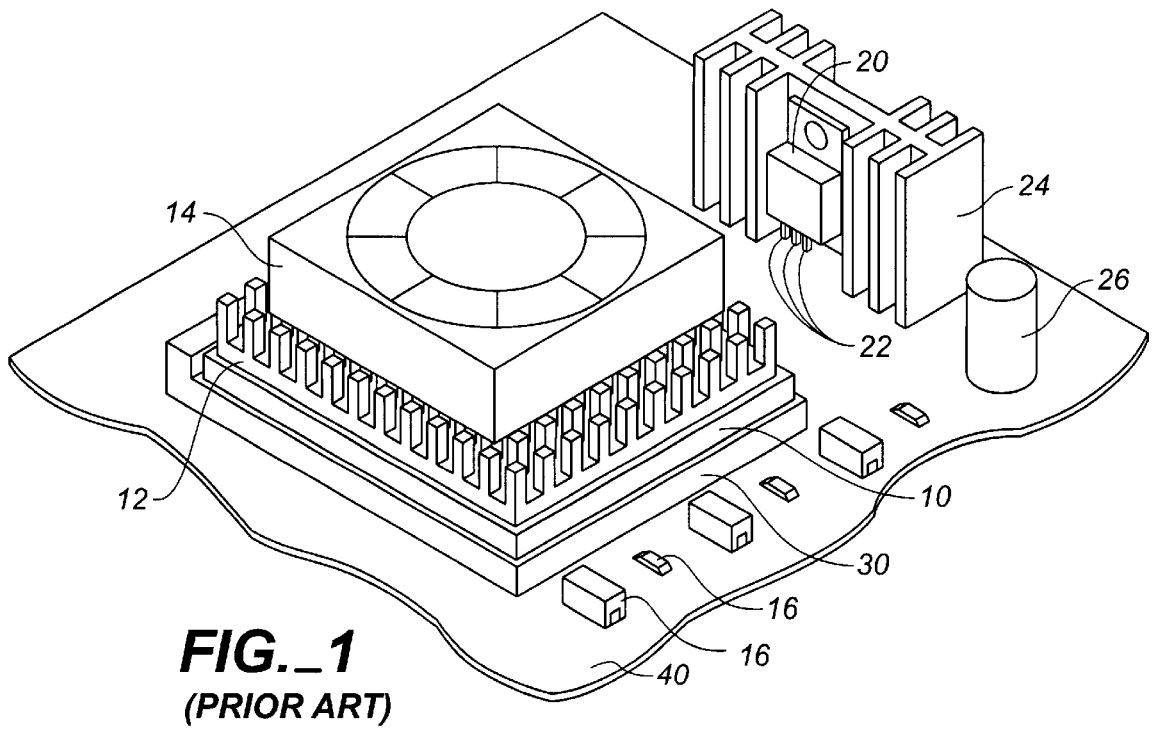
FIG._1
(PRIOR ART)
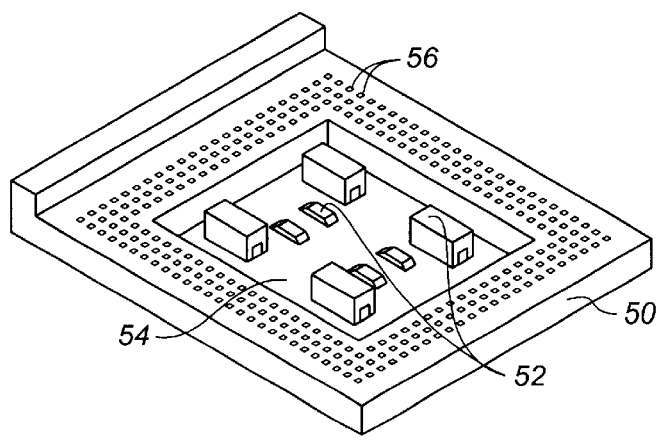
FIG._1A
(PRIOR ART)

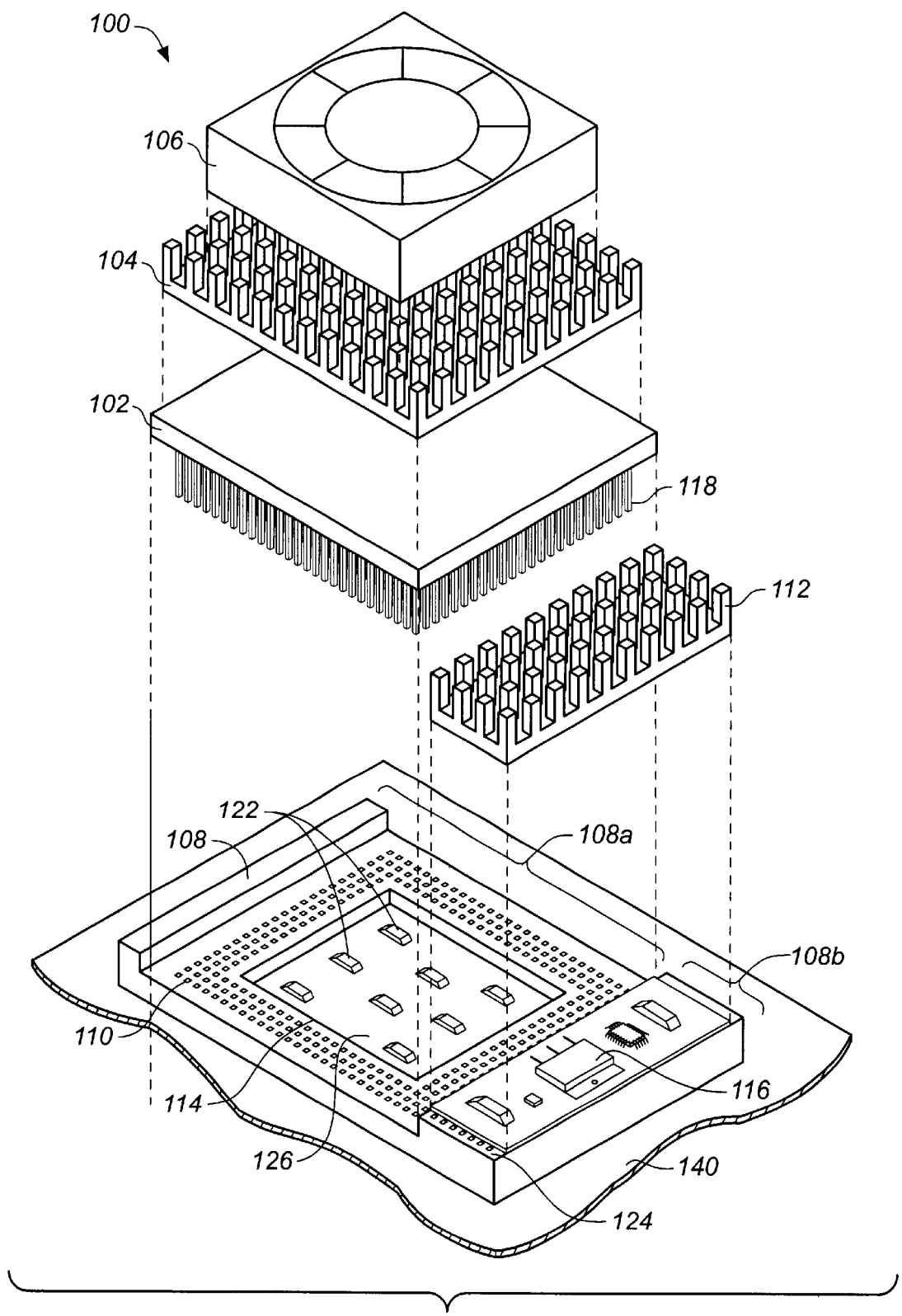
FIG._2

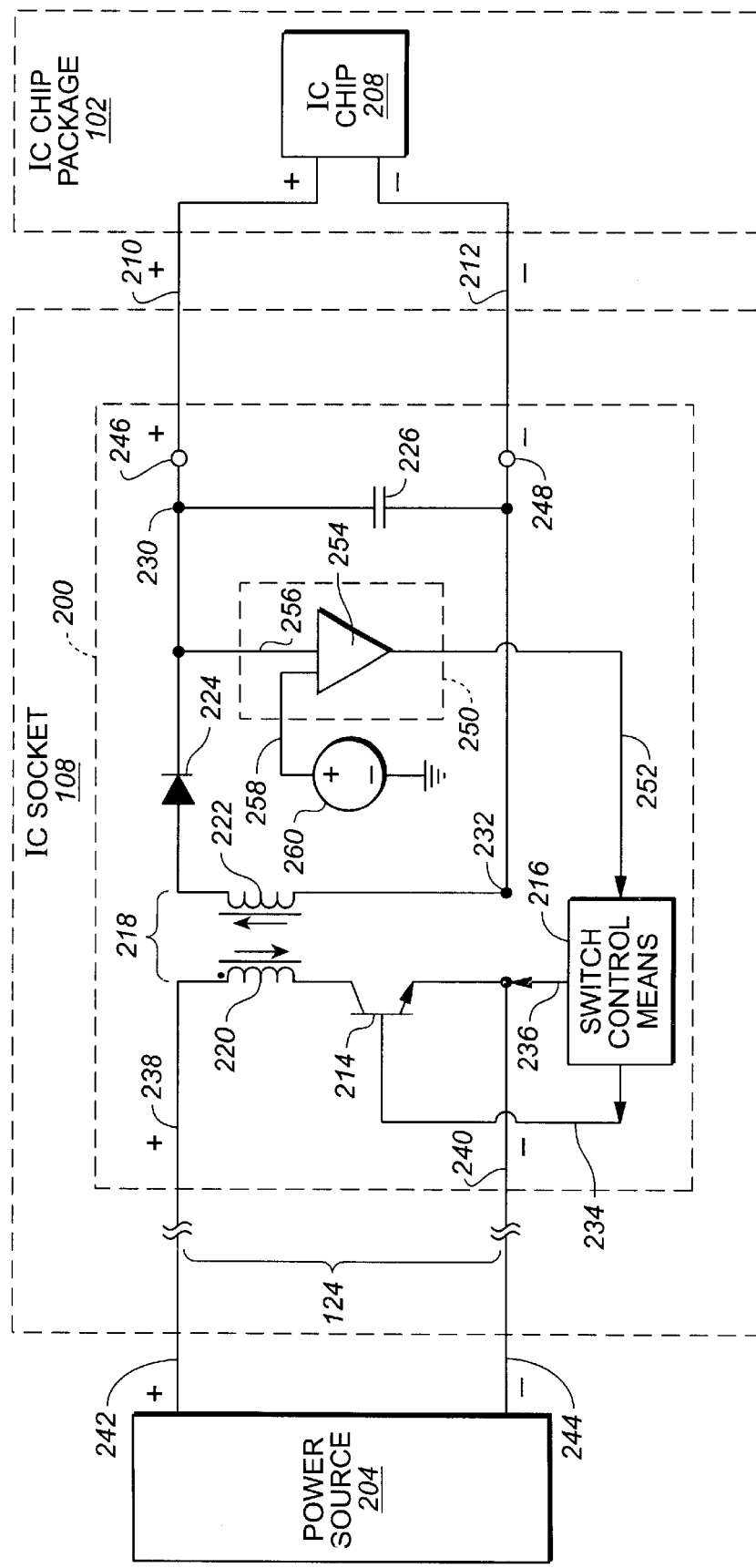
FIG._3

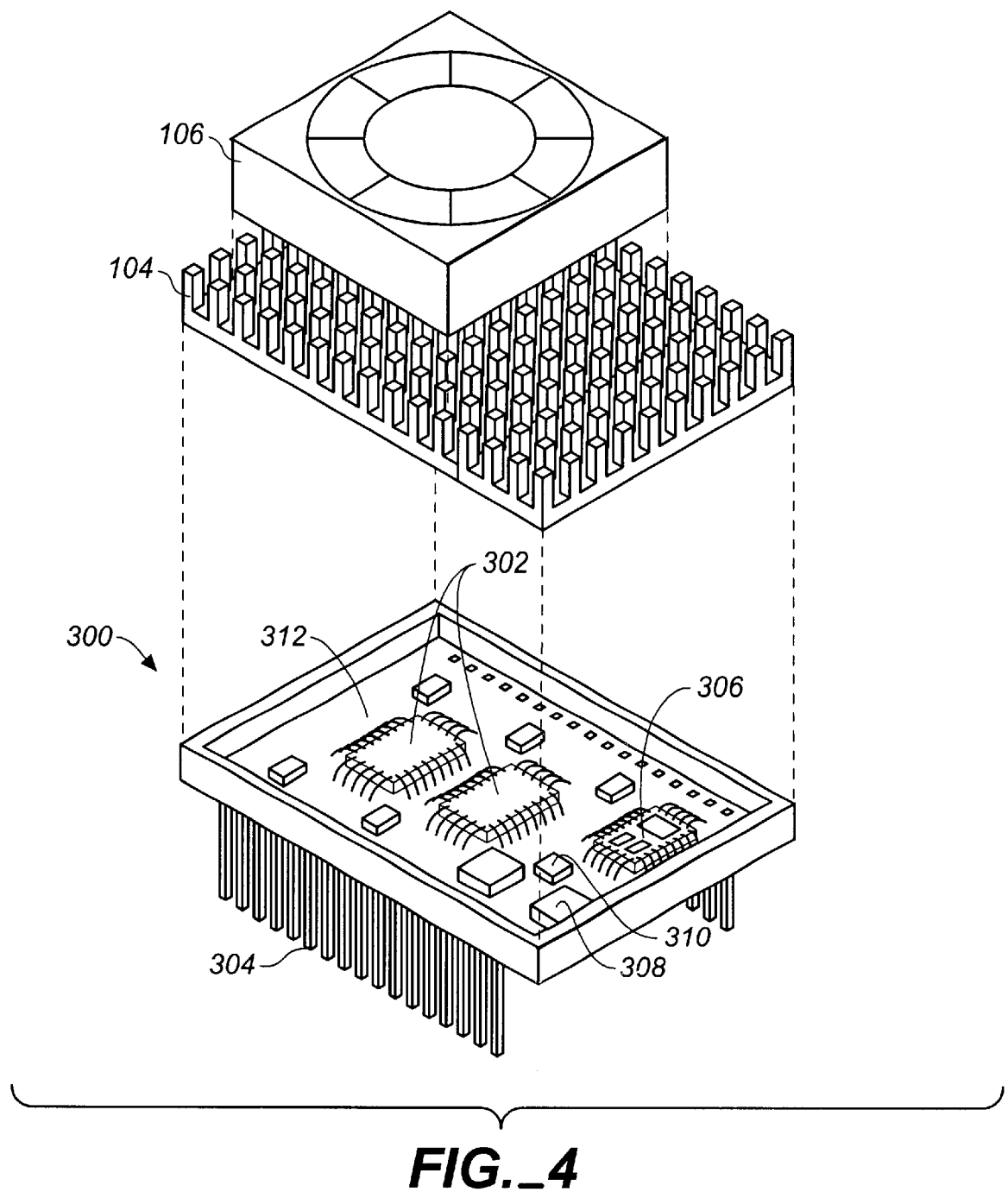
FIG._4

INTEGRATED CIRCUIT MOUNTING STRUCTURE INCLUDING A SWITCHING POWER SUPPLY

This is a division of application Ser. No. 08/523,633 filed Sep. 5, 1995 now U.S. Pat. No. 5,694,297.

BACKGROUND OF THE INVENTION

1. Field of the Invention

The invention relates generally to integrated circuit (IC) mountings, and more particularly to an integrated circuit mounting structure having a switching power supply included therein.

2. Description of the Related Art

High-speed logic circuits contained in integrated circuit (IC) semiconductor chips typically require one or more constant DC supply voltages to be maintained at various circuit locations. In the context of IC packages mounted on a printed circuit board (PCB), these DC supply voltages are conventionally provided to the IC chip(s) by means of a central DC-to-DC power supply. The DC-to-DC power supply is typically either mounted directly on the PCB or is contained in a separate module. In the latter mounting configuration, the voltages generated by the DC-to-DC supply are conductively coupled to the PCB by means of a wire harness or connector coupled to a socket on the PCB. Then, for both prior art mounting configurations, the coupling continues through thin-film conductive tracks on the PCB to an IC package. The IC chip is coupled to the PCB either via an IC socket mounted to the PCB or directly to the external pins of an IC package. Finally, the voltages are coupled through IC package bond wires to the DC voltage-supplying bond pads of the individual semiconductor chip(s) mounted within the IC package.

In state of the art personal computers, for example, where the central processor is an increasingly more complex and higher frequency digital circuit contained on a single IC chip mounted typically on a multilayer PCB characterized as a mother board, the means for supplying DC power to this type of IC must be capable of distributing high currents while maintaining tight voltage tolerances in order for the processor chip to operate within a manufacturer's specifications. The above-described conventional coupling of DC power to the IC chip(s) results in the drawback of relatively long power supply lines. This creates increasing difficulties in maintaining constant and regulated DC supply voltages at the IC chip(s) regardless of transient short term or average long term current demands of these chips.

One such difficulty results from variations in the voltage (or IR) drop in the conductive paths between the DC power supply and the voltage supply contacts of the IC chip(s). As the length of the voltage supply lines increases, the resistance of the lines increases. As the operating speed and complexity of circuits in an IC chip increases, with a corresponding increase in the amount of current demanded by the IC chip, variations in this current demand during normal operation of the IC chip(s) causes substantial variations in the voltage drop across the power supply lines. Normally, the voltage drop along the power supply lines can be reduced by increasing the cross-sectional area of the lines as much as possible. Unfortunately, the current demand is high enough and the constraints on mother board space significant enough that a designer may not be able to size the metal lines large enough to provide DC supply voltages adequate to guarantee proper operation of ICs that have high transient loading characteristics.

The length of the power supply conductive paths also aggravates the problem of parasitic inductive reactance between the power supply paths. Due to the high frequency operation of modern ICs, switching power supplies are subject to more and more severe transient loads. The rate of change of current required from a power supply by an IC will, due to the presence of inductance from power supply conductive paths both internal and external to the IC package, result in modulation of the power supply voltage since the current through an inductor cannot change instantaneously. This modulation of the power supply voltage, commonly referred to as power supply noise and voltage sag, can interfere with data transmission on the signal lines or otherwise interfere with IC operation, and thus pose a serious problem to optimum performance of IC circuitry. A common means of controlling the inductance problem is the use of capacitive filters or decoupling capacitors in very close proximity to an IC chip, both between the power supply terminals external to the IC package and within the cavity of the IC package. While such decoupling capacitors are effective in reducing the magnitude of the power supply noise and voltage sag at the IC chip, significant parasitic inductance still remains as a result of the length of the conductive paths between the IC chip and the power supply so that noise and voltage sag still affect the operation of the ICs.

Another drawback of the lack of physical proximity between the DC power supply and conventionally packaged IC chip structures is the time it takes for the power supply to sense the change in current demand of the ICs. Shorter path lengths between the load and the feedback circuit of a conventional power supply enable more rapid correction for the one or more output voltages generated by the power supply when the level of the output voltages is either above or below their specified level.

Prior art power supply mounting configurations are also expensive to manufacture. External connections, including power supply high current connectors and sockets, to a PCB, and the area or "foot print" occupied by these components and the lengthy conductive paths on a PCB, drive up the cost of a PCB.

The above described drawbacks, ill-effects, and expense associated with conventional coupling between a DC power supply and IC chips may be greatly minimized by positioning the DC power supply as close to the IC chips as technologically possible. This is especially the case for systems where only one or a few IC chips in the system comprised the bulk of the high current demand of the system. Specifically, maximizing the conductive coupling between the power supply and such IC chip(s) will minimize the variations in voltage drop and the inductive reactance within the circuit, reduce the production of thermal build-up, and improve the responsiveness of the power supply to the variations in current demands of the IC. Moreover, more PCB area is needed by the components of the power supply. The overall packaging density can then be increased, thereby reducing the cost of packaging and substrate materials.

SUMMARY OF THE INVENTION

In accordance with the present invention, a mounting structure for providing DC power to an IC package is provided which substantially eliminates the limitations associated with prior art switching power supply structures. The present invention specifically enables a stable power supply voltage to be provided for high speed, high current demand IC chips while improving the packaging density of the system and reducing thermal dissipation.

In one embodiment according to the present invention, the mounting structure includes DC-to-DC switching power supply mounted on the IC's socket for providing DC power to an IC package having one or more IC chips. The mounting structure includes a socket for receiving the IC package and a DC-to-DC switching power supply mounted to the socket. The DC-to-DC switching power supply is electrically coupled to the IC package by conductive paths formed in the socket for supplying at least one specified DC voltage to the IC package. The socket is mountable in a conventional fashion on a printed circuit board.

In a second embodiment according to the present invention, the mounting structure includes a DC-to-DC switching power supply mounted within a hybrid IC package. More particularly, a semiconductor packaging structure is provided which includes a hybrid IC package having at least one IC chip and a DC-to-DC switching power supply mounted within the hybrid IC package preferably on the same substrate. The DC-to-DC switching power supply is electrically coupled to the IC chip by conductive paths formed in the hybrid IC package for supplying at least one specified voltage to the at least one IC chip.

Accordingly, it is a general object of the present invention to provide a mounting structure for providing DC power to an IC package that performs better than prior art mounting structures.

It is another object of the present invention to provide a mounting structure for providing DC power to an IC package which provides close physical proximity of the DC-to-DC switching power supply to the IC semiconductor chip(s) to which it supplies voltage.

Another object of the present invention is to provide a mounting structure for providing DC power to an IC package which minimizes the voltage drop between the switching power supply and the IC semiconductor chip(s) to which it supplies voltage.

It is also an object of the present invention to provide a mounting structure for providing DC power to an IC package which reduces the inductive reactance of the conductive paths between a switching power supply and the IC semiconductor chip(s) to which it supplies voltage.

Another object of the present invention is to provide a mounting supply structure for providing DC power to an IC package which improves the responsiveness of the switching power supply to variations in the current demands of the IC semiconductor chip(s) to which it supplies voltage.

Another object of the present invention is to provide a mounting structure for providing DC power to an IC package which minimizes the amount of heat generated by the conductive coupling between the switching power supply and the IC semiconductor chip(s) to which it supplies voltage.

Another object of the present invention is to provide a mounting structure for providing DC power to an IC package in which the switching power supply is cooled by the same thermal dissipation means that is used to reduce the temperature of the IC semiconductor chip package.

Another object of the present invention is to provide a mounting structure for providing DC power to an IC package which reduces the PCB area needed by the DC power supply.

Still another object of the present invention is to provide a mounting structure for providing DC power to an IC package which is more cost effective than prior art mounting structures.

These and other objects and advantages of the present invention will become more apparent from the following detailed description and the accompanying drawings.

BRIEF DESCRIPTION OF THE DRAWINGS

FIG. 1 is a perspective view of a prior art IC semiconductor package and adjacent isolated DC power supply mounted on a mother board.

FIG. 1A shows a prior art IC socket on a PCB, with IC and heatsink removed.

FIG. 2 is a exploded perspective view of one embodiment of the mounting structure of the present invention.

FIG. 3 is a schematic of an exemplary DC-to-DC switching power supply regulator coupled to an IC package according to the present invention.

FIG. 4 is a second embodiment of the mounting structure of the present invention.

DESCRIPTION OF THE PREFERRED EMBODIMENT

Referring now to FIG. 1, there is shown a prior art configuration of an IC semiconductor chip package 10 and accompanying linear DC power supply regulator 20, both positioned on a printed circuit board (PCB) 40. When the system's controller, including a microprocessor chip is mounted on such a PCB, it is sometimes referred to as a motherboard. The prior art configuration of FIG. 1 has a conventional structure with the output power from power supply regulator 20 coupled to IC package 10 with motherboard 40 in a conventional fashion, as described above.

Mounted on IC package 10 is a heat sink 12 upon which is mounted a fan 14, both of which facilitate the dissipation of heat generated by IC package 10. IC package 10 is in turn mounted on a conventional IC socket 30 which is conventionally mounted on PCB 40. Regulator 20 has voltage supply pins 22 for supplying one or more specified regulated voltages to the voltage inputs of the individual IC chips (not shown) within IC package 10. The power supply lines between pins 22 and the voltage inputs of IC package 10 are typically foil copper metal tracks (not shown) on PCB 40. Regulator 20 is mounted on PCB 40 adjacent to a heat sink 24 for dissipating heat generated thereby.

Such a configuration, in which the path of the power supply lines is relatively lengthy, is susceptible to the problems discussed above. In order to control the noise caused by the transient current surges demanded by the IC, decoupling capacitors 16 are mounted on PCB 40 adjacent to IC package 10 and regulator 20. FIG. 1A illustrates an IC socket 50 with IC removed. The top surface of socket 50 has a plurality of pin holes 56, in an arrangement framing cavity 54, for receiving a corresponding plurality of pins protruding perpendicularly from the bottom of an IC package (not shown). Socket 50, via the coupling of pin holes 56 and corresponding pins of an IC package, provide electrical coupling of both power and signal lines between an IC package and a PCB. Various capacitors 52 are seated within a cavity 54 of socket 50 for controlling parasitic inductance. This second prior art configuration reduces the overall volume of an IC package or module but does not completely solve the inductance problem.

We now turn to a description of the present invention as illustrated in FIGS. 2 and 3. In FIG. 2 there is shown an exploded view of one embodiment of a mounting structure 100 of the present invention mounted on a PCB 140. Mounting structure 100 includes an IC package 102. IC package 102 is comprised of single or multiple IC chips packaged by techniques commonly known in the art of microelectronics packaging. Mounted on IC package 102 is a heat sink 104 which in turn is mounted by fan 106 for the dissipation of heat generated by IC package 102. IC package 102 is in turn mounted on an IC socket 108, having portions 108a and 108b, which is electrically coupled to PCB 140 by conventional techniques.

The electrical coupling between IC package 102 and IC socket 108 is accomplished by means of the mating of a plurality of pins 118, which perpendicularly extend from the bottom of IC package 102, and a plurality of corresponding pin holes 110 within the top surface of portion 108a of IC socket 108. The arrangement of plurality of pin holes 110 define a cavity 114 within portion 108a having a substrate 126 therein upon which are mounted a plurality of decoupling capacitors 122. Within portion 108b of socket 108 is a DC-to-DC switching power supply, which includes a DC-to-DC switching power supply regulator 116 and various other electronic components (not individually referenced), from which one or more regulated DC voltages are supplied to the IC chip(s) of IC package 102. The output voltage(s) of the DC-to-DC switching power supply are electrically coupled to the voltage-supplying bond pads of IC package 102 by means of thin-film metal tracks or conductive paths that run between portions 108a and 108b on substrate 126, as described below with respect to FIG. 3. Decoupling capacitors 122 are electrically coupled at these outputs of the DC-to-DC power supply for minimizing the affect of parasitic inductance in these conductive paths. Within the top surface of portion 108b is a connector socket 124 also referred to herein as connector coupling 124 for receiving a power source connector (not pictured) for providing energy to the DC-to-DC switching power supply within portion 108b from a remote source of power. Mounted on the top surface of portion 108b is a heat sink 112 for dissipating heat generated by the switching power supply.

FIG. 3 shows a schematic of the mounting structure of FIG. 2. There is shown the basic features of a an exemplary DC-to-DC switching power supply 200, which is well known in the art and having corresponding components within portion 108b of socket 108 of FIG. 2, coupled to exemplary IC package 102.

Switching power supply 200 comprises input lines 242 and 244, an N-P-N transistor 214, a switch control means 216, a transformer 218, a rectifier diode 224, an output filter capacitor 226, feedback means 250, and output lines 246 and 248. Transformer 218 includes a first inductor 220 and a second inductor 222, each inductor having a coil winding and preferably a ferromagnetic core. Inductor 220 and transistor 214 are coupled in series, and this serial combination is coupled across input lines 238 and 240. Switch control means 216 has one output line 234 coupled to the base of transistor 214, a second output line 236 coupled to the emitter of transistor 214, and an input line 252 which receives a feedback signal from the output of feedback means 250. Feedback means 250 comprises comparator 254 having two feedback inputs 256, 258. Feedback input 256 is coupled to the output of rectifier diode 224 at node 230 and input 258 is supplied by a reference voltage 260. Switch control means 216, typically a pulse width modulator, generates a control signal at line 234 to direct the operation of transistor 214 such that energy is periodically coupled at input lines 242 and 244 to transformer 218 in a plurality of consecutive cycles, each cycle comprising an ON period and an OFF period. Rectifier diode is coupled between inductor 222 and node 230 to enable energy during each ON period to be coupled to the power supply output lines 246 and 248. Filter capacitor 226 is coupled across output lines 246 and 248 and serves to minimize the ripple of the current at the output.

The DC-to-DC switching power supply 200 of FIG. 3 and the operation thereof have only briefly been described as they are commonly known in the art. For purposes of the present invention, the DC-to-DC switching power supply is designed to be as efficient as possible to reduce the amount of thermal build-up within, and respond quickly to the transient current demand of the ICs so that, under all conditions, tightly regulated DC voltages are maintained across the voltage supplying bond pads of the respective IC chips. The IC mounting structures of the present invention may be used with any DC-to-DC switching power supply known in the art, including but not limited to buck, boost, buck-boost, Cuk, SEPIC and zeta converters using pulse width modulation, zero voltage switching techniques, or full or partial resonant switching techniques, self oscillating or clocked converters, and operating at any fixed or variable switching frequency. Preferably, however, a "buck converter" switching power supply, as disclosed in U.S. Pat. No. 5,410,467 (issued to the assignee of the present invention), is employed with the mounting structure of the present invention. The disclosure of this patent is hereby incorporated by reference.

Returning to the description of FIG. 3, the input side of switching power supply 200 is coupled to a power source 204 for receiving a source of input power by means of connector coupling 124 on socket 108 (the structure of which is illustrated in FIG. 2 and described above). Specifically, connector coupling 124 electrically couples power source output lines 242 and 244 to switching power supply input lines 238 and 240, respectively. The output side of switching power supply 200 is coupled to IC package 102. Conductive paths 210, 212 provide electrical coupling between the switching power supply output lines 246, 248 and IC chip 208. In the context of the embodiment illustrated in FIG. 2, these conductive paths (not shown) comprise the output pins (not shown) of the switching power supply, the conductive tracks (not shown) that run between portions 108a and 108b from these output pins to pin holes 110 of socket 108 to the voltage supply pins 118 of IC package 102, and the respective voltage-supplying bond pads of the IC chip(s) within IC package 102. It should be noted that, although only one IC chip 208 is illustrated, some IC packages can comprise more than one IC chip, and such multichip configurations are contemplated to be within the scope of the present invention.

Referring now to FIG. 4, there is shown another embodiment of the present invention. A semiconductor mounting or packaging structure is shown within a hybrid IC package 300, with its top surface removed for the purpose of illustration. This embodiment is preferred in cases where it is feasible to incorporate the DC-to-DC switching power supply into the IC package itself.

In general, and as used here, a hybrid integrated circuit is defined as consisting of several separate component parts attached to a ceramic substrate or the like and interconnected either by wire bonds, a suitable metalization pattern, or the like. The individual parts are unencapsulated and may consist of diffused or thin-film components or one or more monolithic circuits. A hybrid circuit is much smaller than a circuit made from discrete packaged components and once fabricated, an individual component cannot be altered without destroying the entire circuit. Any hybrid circuit comprised of single chip (SCM) or multichip modules (MCM) employing the IC mounting structure as described below is considered to be within the scope of the present invention.

Returning to the description of FIG. 4, hybrid IC package 300 has pins 304 for coupling with the corresponding pin holes of an IC socket (not shown), or with a PCB such as a motherboard. Hybrid package 300 has a substrate 312 on which are mounted various IC chips 302 (only two are shown for purposes of illustration), DC-to-DC switching power supply in the form of an IC chip 306, and various capacitive filters 308 and inductive filters 310 which are electrically coupled to the outputs of the DC-to-DC switching power supply. Interconnection between these components is accomplished by means of wire bonds or a suitable, commonly known metalization patterning techniques. With switching power supply 306 directly coupled to IC chips 302, the length of the conductive paths between switching power supply 306 and IC chips 302 is greatly minimized. The electronic filters 308, 310 help to minimize the affect of parasitic inductances.

For all embodiments of the present invention, the close proximity of the DC-to-DC switching power supply to the IC package allows the thermal dissipation means (e.g., conduction, air flow, and liquid flow) employed to cool the IC package to also be used to remove heat and cool the switching power supply. For example, in the embodiment of the present invention in which the switching power supply is mounted within the IC socket (see FIG. 2), the heat sink and fan used to dissipate heat from the IC package is also helpful in dissipating heat from the socket. In the embodiment of the present invention in which the switching power supply is mounted within the hybrid IC package itself (see FIG. 4), the heat dissipation means used will cool the switching power supply directly.

In summary, with the mounting structures of the present invention, the DC-to-DC switching power supply is in a much closer electrical proximity to the IC chip(s) to which it supplies voltages. This close electrical proximity between the IC chip(s) and the switching power supply provides several advantages over prior art configurations. First, the reduction of the conductive path lengths between the switching power supply and the IC chip(s) minimize the voltage drop and the inductive reactance created between the power supply and the IC package. Second, the shorter conductive path lengths also minimize the resistive heat generated thereby. Third, the thermal dissipation means (i.e., fan and heat sink) used by the IC package can also be used to remove heat from the switching power supply. This reduces the number of components of an IC module, reducing the overall occupied area of a mother board, which in turn eliminates the need for additional sockets and connectors for coupling a DC-to-DC power supply to the mother board. Thus, substrate material and packaging costs are reduced.

The above detailed description is intended to be exemplary rather than exhaustive. It will be apparent to those skilled in the art that there are many variations and equivalents of that which has been described. Accordingly it is intended that the appended claims will cover any such modifications or embodiments that fall within the scope of the invention.

What is claimed:

1. A semiconductor packaging structure, comprising:
   a hybrid IC package having at least one IC chip mounted therein;
   a DC-DC switching power supply mounted within said hybrid IC package and electrically coupled to said at least one IC chip by conductive paths formed in said hybrid IC package for supplying at least one specified voltage to said at least one IC package; and
   electrical connectors for coupling the inputs of said DC-DC switching power supply to a remote power source.

2. The semiconductor packaging structure of claim 1, further comprising:
   one or more electronic filters mounted within said hybrid IC package and electrically coupled between said DC-to-DC switching power supply and said hybrid IC package for minimizing the effect of parasitic inductance in said conductive paths.

3. The semiconductor packaging structure of claim 1, further comprising heat dissipation means mechanically coupled to said hybrid IC package for dissipating heat generated by said hybrid IC package.

4. The semiconductor packaging structure of claim 3 wherein said heat dissipation means further comprises cooling means for further dissipating heat generated by said hybrid IC package, said DC-to-DC switching power supply, and said conductive paths.

5. The semiconductor packaging structure of claim 4 wherein said cooling means is a fan.

6. The semiconductor packaging structure of claim 3 wherein said heat dissipation means comprises a heat conducting structure mechanically coupled to said hybrid IC package.

7. A hybrid IC package structure, comprising:
   an insulating substrate;
   a DC-to-DC switching power supply mounted to said substrate, said DC-to-DC switching power supply having as outputs at least one specified voltage;
   at least one IC chip mounted to said substrate;
   an electronic filter mounted to said substrate, said filter electrically coupled between said at least one IC and said DC-to-DC switching power supply; and
   electrical interconnections between one of the outputs of said DC-DC switching power supply and said at least one IC chip;
   wherein the impedance of said electronic filter is selected to minimize the affect of parasitic inductance in said electrical interconnections.

8. The structure of claim 7, wherein said electrical interconnections comprise wire bonds.

9. The structure of claim 7, wherein said electrical interconnections comprise a patterned metal.

10. The structure of claim 7, further comprising a common heat sink mechanically coupled to said substrate and thermally coupled to said at least one IC chip, said DC-to-DC switching power supply, and said electrical interconnections.

* * * * *